(12) United States Patent
Anderson et al.

(10) Patent No.: US 7,494,850 B2
(45) Date of Patent: Feb. 24, 2009

(54) ULTRA-THIN LOGIC AND BACKGATED ULTRA-THIN SRAM

(75) Inventors: Brent A. Anderson, Jericho, VT (US); Andres Bryant, Essex Junction, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 11/276,135

(22) Filed: Feb. 15, 2006

(65) Prior Publication Data

US 2007/0187769 A1 Aug. 16, 2007

(51) Int. Cl.
*H01L 21/20* (2006.01)
*H01L 29/06* (2006.01)

(52) U.S. Cl. ...................... 438/141; 257/192

(58) Field of Classification Search ................ 438/138, 438/141; 257/192, 191, 314, E21.66, E21.65, 257/E21.63, E21.44
See application file for complete search history.

(56) References Cited

U.S. PATENT DOCUMENTS

| | | | | |
|---|---|---|---|---|
| 4,905,063 A | * | 2/1990 | Beltram et al. | ............... 257/191 |
| 5,068,756 A | * | 11/1991 | Morris et al. | ............... 257/192 |
| 6,063,686 A | | 5/2000 | Masuda et al. | |
| 6,252,281 B1 | | 6/2001 | Yamamoto et al. | |
| 6,664,143 B2 | * | 12/2003 | Zhang | ......................... 438/138 |
| 2002/0043693 A1 | | 4/2002 | Tiwari et al. | |
| 2003/0006446 A1 | | 1/2003 | Forbes et al. | |
| 2005/0023530 A1 | | 2/2005 | Koyama | |
| 2005/0023615 A1 | | 2/2005 | Yano et al. | |
| 2005/0110078 A1 | | 5/2005 | Shino | |
| 2005/0121722 A1 | | 6/2005 | Oyamatsu | |
| 2007/0138533 A1 | * | 6/2007 | Dennard et al. | ............. 257/314 |

\* cited by examiner

*Primary Examiner*—Davienne Monbleau
*Assistant Examiner*—Monica D Harrison
(74) *Attorney, Agent, or Firm*—Gibb I.P. Law Firm, LLC; Anthony Canale

(57) ABSTRACT

Disclosed are embodiments of a structure that comprises a first device, having multiple FETs, and a second device, having at least one FET. Sections of a first portion of a semiconductor layer below the first device are doped and contacted to form back gates. A second portion of the semiconductor layer below the second device remains un-doped and un-contacted and, thus, functions as an insulator. Despite the performance degradation of the first device due to back gate capacitance, the back gates result in a net gain for devices such as, SRAM cells, which require precise Vt control. Contrarily, despite marginal Vt control in the second device due to the absence of back gates, the lack of capacitance loading and the added insulation result in a net gain for high performance devices such as, logic circuits.

18 Claims, 5 Drawing Sheets

ULTRA-THIN LOGIC AND BACKGATED ULTRA-THIN SRAM

BACKGROUND

1. Field of the Invention

The embodiments of the invention generally relate ultra thin semiconductor devices and, more particularly, to a semiconductor structure and method of forming the structure that incorporates a first ultra-thin device having field effect transistors (FETs) with both front and back gates and a second ultra-thin device having FETs with only front gates.

2. Description of the Related Art

Ultra-thin silicon-on-insulator (UTSOI) field effect transistors (FETs) formed from wafers in which the active silicon layer is less 20 nm thick and therefore, fully depleted, show promise for incorporation into various semiconductor devices (e.g., logic circuits, memory cells, SRAM cells, analog devices, etc).

Such FETs can be formed either with or without back gates and the decision to form them with or without the back gates involves a trade-off between the need for threshold voltage (Vt) control and the need to avoid device performance degradation (i.e., reduction in speed) due to parasitic back gate capacitance. For example, devices formed with double-gated UTSOI FETs (i.e., FETs with both front and back gates) suffer from performance degradation, but exhibit optimal Vt control. Whereas, devices formed with single-gated UTSOI FETs (i.e., FETs with only a front gate) avoid performance degradation (i.e., maintain speed), but exhibit only marginal Vt control.

Consequently, devices that do not need fast switching speeds but require precise Vt control (e.g., static random access memory (SRAM) cells, analog devices designed for a specific function, etc.) may benefit from being formed with double-gated FETs. Contrarily, devices that require high performance (i.e., fast switching speeds) and need only marginal threshold voltage (Vt) control (e.g., logic circuits, analog devices designed for a specific function, etc.) may benefit from being formed with single-gated FETs. However, since it is often necessary to incorporate both types of devices on the same chip, there is a need in the art for a semiconductor structure that comprises both UTSOI FETs with front and back gates and UTSOI FETs with only front gates.

SUMMARY

In view of the foregoing, an embodiment of the invention provides a semiconductor structure that comprises both a first device (e.g., a static random access memory (SRAM) cell) that incorporates FETs configured for precise threshold voltage (Vt) control and a second device (e.g., a logic circuit) that incorporates FETs configured to have high switching speeds. Specifically, the first device comprises first field effect transistors with both front and back gates and the second device comprises front-gated second field effect transistors positioned above an intrinsic semiconductor film. Another embodiment of the invention provides a method of forming this semiconductor structure.

More particularly, an embodiment of the semiconductor structure of the invention comprises a substrate, a semiconductor layer above the substrate and both a first device (e.g., a memory cell, an SRAM cell or another device having multiple field effect transistors that require precise Vt control) and a second device (e.g., a logic circuit or another high performance device) above the semiconductor layer. A first portion of the semiconductor layer below the first device is sectioned and each section is appropriately doped to form back gates for the various field effect transistors. A second portion of the semiconductor layer below the second device remains un-doped.

More specifically, the first and second devices are formed from a double silicon-on-insulator wafer comprising a first insulator layer on a substrate, a first intrinsic semiconductor layer (i.e., an un-doped semiconductor layer such as an un-doped silicon or polysilicon layer) on the first insulator layer, a second insulator layer on the first intrinsic semiconductor layer and an ultra-thin second semiconductor layer (e.g., a sub-20 nm thick silicon layer) on the second insulator layer.

The first device can comprise a plurality of double-gated field effect transistors (i.e., first FETs each having a front gate that is electrically separated from a back gate). These first FETs can include at least one n-type FET and at least one p-type FET (e.g., multiple n-FETs and p-FETs for a 6T-SRAM cell). The bodies of each first FET can comprise source/drain diffusion regions and a channel region within the ultra-thin second semiconductor layer. The FET bodies can be isolated by shallow trench isolation (STI) structures that extend through the second semiconductor layer to the second insulator layer. Those skilled in the art will recognize that if the second semiconductor layer is less than 20 nm thick, then the resultant FETs will be fully-depleted.

Each first FET comprises a front gate above the channel region (i.e., a gate dielectric above the channel region and a gate conductor above the gate dielectric). This front gate can be used to control output current.

As mentioned above, each first FET also comprises a discrete back gate below the channel region (i.e., a back gate dielectric below the channel region and a back gate conductor below the back gate dielectric). Specifically, deep trench (DT) isolation structures that extend through the second semiconductor layer to the first insulator layer can define first and second portions of the first semiconductor layer and further define sections of the first portion that will form back gate conductors. These DT isolation structures not only define the size and shape of the back gates, but also isolate the back gates. Each back gate conductor (i.e., each section of the first portion of the first semiconductor layer) is appropriately doped with either a p-type dopant or an n-type dopant for incorporation into either a p-FET or an n-FET, respectively.

The first device further comprises contacts to each of the discrete back gates so as to allow independent threshold voltage control of the first FETs despite performance degradation of the first device due to parasitic back gate capacitance.

The second device can comprise one or more single-gated FETs (i.e., second field effect transistors each having only a front gate). As with the first device, the second device can also include at least one n-type FET and at least one p-type FET. The bodies of each second FET can comprise source/drain diffusion regions and a channel region within the ultra-thin second semiconductor layer. The FET bodies can be isolated by shallow trench isolation (STI) structures that extend through the second semiconductor layer to the second insulator layer. As mentioned above, those skilled in the art will recognize that if the second semiconductor layer is less than 20 nm thick, then the resultant FETs will be fully-depleted.

Each second FET comprises a front gate above the channel region (i.e., a gate dielectric above the channel region and a gate conductor above the gate dielectric). This front gate can be used to control output current. However, instead of a back gate for each second FET, a second portion of the semiconductor layer below the second device remains un-doped (i.e., intrinsic). Specifically, this second portion of the semiconductor layer comprises a remaining portion of the first intrinsic semiconductor layer after the formation and doping of the discrete back gates for the first FETs of the first device. Since the second portion of the first semiconductor layer below the second device is neither doped, nor contacted, it functions not as a back gate but simply as an added insulator for the second device and, thus, allows the second device to avoid performance degradation caused by parasitic back gate capacitance.

An embodiment of the method of the invention comprises first providing a wafer having a first insulator layer on a semiconductor substrate, a first intrinsic semiconductor layer (e.g., an un-doped polysilicon layer) on the first insulator layer, a second insulator layer on the first semiconductor layer and a second semiconductor layer (e.g., a sub-20 nm silicon layer) on the second insulator layer.

Shallow and deep trench (DT) isolation structures are formed in the wafer using conventional processes. The deep trench isolation structures are formed so that they extend through the second semiconductor layer to the first insulator layer. These deep trench isolation structures will define the size and shape of the subsequently formed back gates as well as isolate those back gates once formed. Specifically, these deep trench isolation structures divide the first intrinsic semiconductor layer into multiple a first portion and a second portion and further divide the first portion into multiple sections. The shallow trench isolation structures are formed so that they extend through the second semiconductor layer to the second insulator layer. These shallow trench isolation structures divide up the second semiconductor layer into additional sections above both the first portion and second portion of the first intrinsic semiconductor layer. These additional sections will subsequently be used to form field effect transistors for a first device above the first portion and a second device above the second portion.

After the trench isolation structures are formed, a mask is formed over the second portion and the sections of the first portion of the first semiconductor layer are implanted with dopants to form back gates. Specifically, a masked implantation process is used to form in each section as either an n-FET back gate or a p-FET back gate. More specifically, one or more of the sections of the first portion (i.e., a first group of one or more sections) are masked. Then, any unmasked sections (i.e., a second group of one or more sections) are implanted with a first conductivity type dopant to form at least one doped back gate for at least one first conductivity type FET. For example, a p-type dopant such as, boron (B), can be implanted to form at least one p-doped polysilicon back gate conductor for at least one p-FET. Following the first implant, the mask over the first group of sections is removed and the second (doped) group is masked. A second implantation process implants the unmasked sections (i.e., the first group of sections) with a second conductivity type dopant to form at least one doped back gate for at least one second conductivity type FET. For example, an n-type dopant such as, phosphorus (P), arsenic (As) or antimony (Sb), can be implanted to form at least one n-doped polysilicon back gate conductor for at least one n-FET.

Once the back gates are formed for the FETs of the first device, conventional complementary metal oxide semiconductor (CMOS) processing continues to form field effect transistors (FETs) in the various sections of the second semiconductor layer. Specifically, both n-type and p-type FETs can be formed above the n-doped and p-doped back gates, respectively, in order to form a first device (e.g., a memory cell, a static random access memory cell, or another device that requires precise Vt control). Similarly, one or more n-type and/or p-type FETs can be formed above the second portion of the second intrinsic semiconductor layer (i.e., the remaining intrinsic semiconductor film) in order to form a second device (e.g., a logic circuit or another high performance device). As mentioned above, those skilled in the art will recognize that if the second semiconductor layer is less than 20 nm thick, then the resultant FETs will be fully-depleted.

Subsequent processing also includes forming isolated contacts to the back gates, e.g., by etching a contact hole through a BEOL insulator, STIs and the second insulator layer to the back gates and filling the contact hole with a conductive material (e.g., n-doped polysilicon for n-FETs and p-doped polysilicon for p-FETs).

Since the fully-depleted first FETs that are incorporated into the first device are formed with back gates/back gate contacts, the threshold voltage of these FETs may be independently controlled. Despite the resultant performance degradation due to parasitic back gate capacitance, these back gates result in a net gain for devices such as, SRAM cells, which require precise threshold voltage control. Contrarily, the second device incorporates the fully-depleted second FETs that are formed above an intrinsic semiconductor film (i.e., above the second portion of the first intrinsic semiconductor layer). This intrinsic semiconductor film remains un-doped and un-contacted and thus, functions only as an added insulator and not a back gate. Despite marginal threshold voltage control due to the lack of back gates, the lack of capacitance loading (i.e., back gate capacitance) and the added insulation result in a net gain for high performance devices such as, logic circuits.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
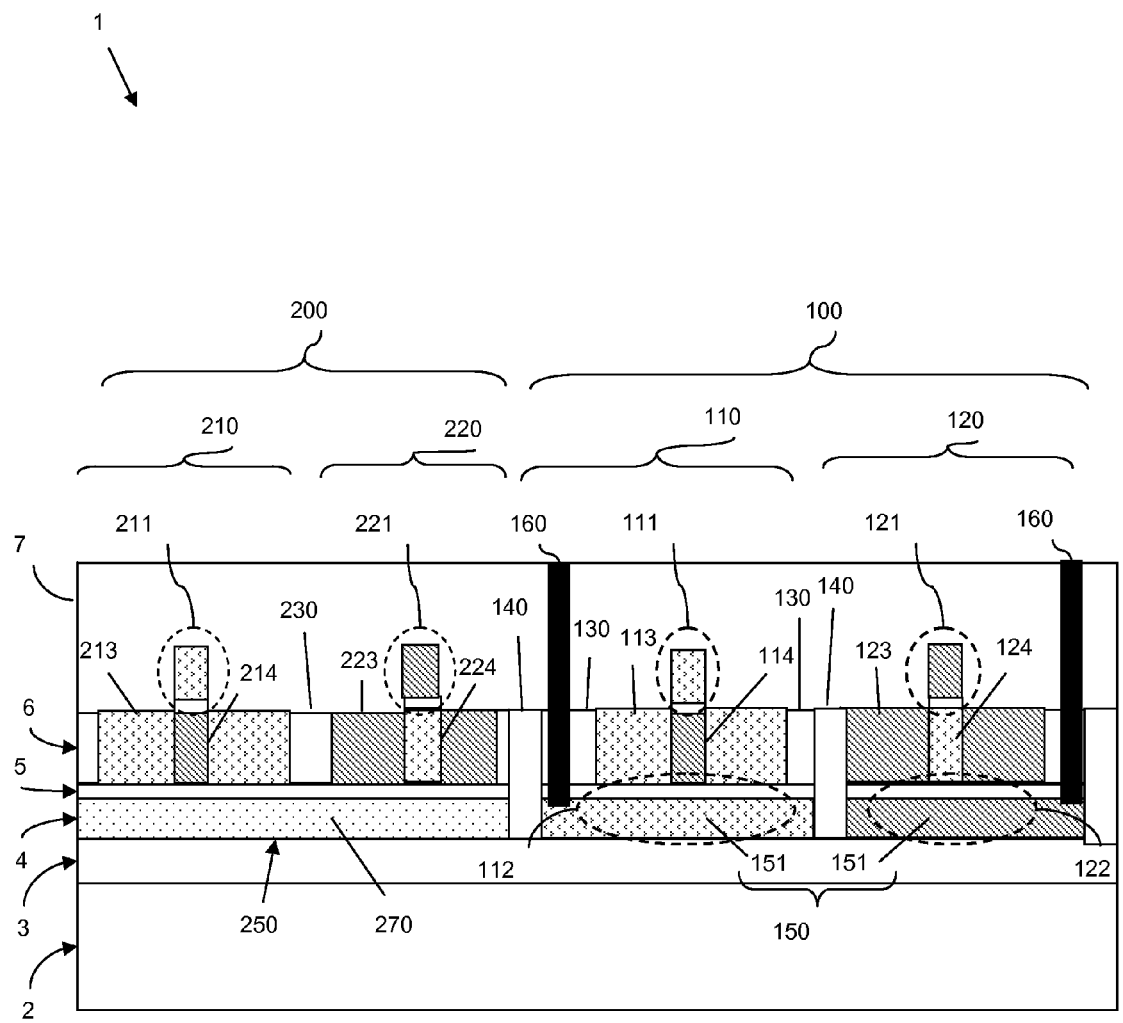
FIG. 1 is a schematic block diagram illustrating a cross-sectional view of an embodiment of the semiconductor structure of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, semiconductor devices that do not need fast switching speeds but require precise Vt control (e.g., static random access memory (SRAM) cells, analog devices designed for a specific function, etc.) may benefit from being formed with double-gated FETs. Contrarily, semiconductor devices that require high performance (i.e., fast switching speeds) and need only marginal threshold voltage (Vt) control (e.g., logic circuits, analog devices designed for a specific function, etc.) may benefit from being formed with only single-gated FETs. However, since it is often necessary to incorporate both types of devices on the same chip, there is a need in the art for a semiconductor structure that comprises both FETs with front and back gates and FETs with only front gates. Therefore, disclosed herein is a semiconductor structure that integrates both double-gated (i.e., front and back-gated) UTSOI FETs with single-gated (i.e., front gate only) UTSOI logic FETs as well as a method of forming the structure.

More particularly, referring to FIG. 1, an embodiment of the semiconductor structure 1 of the invention comprises a substrate 2, a semiconductor layer 4 above the substrate 2 and both a first device 100 (e.g., a memory cell, an SRAM cell or another device having multiple field effect transistors that require precise Vt control) and a second device 200 (e.g., a logic circuit or another high performance device) above the semiconductor layer 4. A first portion 150 of the semiconductor layer 4 below the first device 100 is divided into sections 151 and each section 151 is appropriately doped to form back gates 112, 122 for the various field effect transistors 110, 120 of the first device 100. A second portion 250 of the semiconductor layer 4 below the second device 200 remains un-doped. The devices 100, 200 are formed from a double silicon-on-insulator wafer comprising a first insulator layer 3 (e.g., a first buried oxide layer) on a substrate 2, a first semiconductor layer 4 (e.g., an intrinsic (i.e., un-doped) silicon or polysilicon layer) on the first insulator layer 3, a second insulator layer 5 (e.g., a second buried oxide layer) on the first semiconductor layer 4 and an ultra-thin second semiconductor layer 6 (e.g., a sub-20 nm thick silicon layer) on the second insulator layer 5.

The first device 100 can comprise a plurality of double-gated fully-depleted field effect transistors 110, 120 (i.e., first FETs each having a front gate 111, 121 that is electrically separated from a back gate 112, 122). These first FETs 110, 120 can include at least one n-type FET 120 and at least one p-type FET 110 (e.g., multiple n-FETs and p-FETs for a 6T-SRAM cell). The bodies of each first FET 110, 120 can comprise source/drain diffusion regions 113, 123 and a channel region 114, 124 within the ultra-thin second semiconductor layer 6. These FET bodies can be isolated by shallow trench isolation (STI) structures 130 that extend through the second semiconductor layer 6 to the second insulator layer 5. Those skilled in the art will recognize that if the second semiconductor layer 6 is less than 20 nm thick, then the resultant FETs 110, 120 will be fully-depleted.

Each first FET 110, 120 comprises a front gate 111, 121 above the channel region 114, 124 (i.e., a gate dielectric above the channel region and a gate conductor above the dielectric layer). The gate conductor can, for example, comprise a p+ doped polysilicon for p-FET 110 or an n+ doped polysilicon for the n-FET 120. This front gate 111, 121 can be used to control output current.

Each first FET 110, 120 also comprises a discrete back gate 112, 122 below the channel region 114, 124 (i.e., a back gate dielectric below the channel region and a back gate conductor below the back gate dielectric). Specifically, deep trench (DT) isolation structures 140 extend through the second semiconductor layer 6 to the first insulator layer 3. These DT isolation structures 140 can define a first portion 150 of the first semiconductor layer 4 below the first device 100 and a second portion 250 of the first semiconductor layer 4 below the second device 200. Additionally, these DT isolation structures 140 can divide both the second insulator layer below the first device 100 into sections to form back gate dielectrics and the first portion 150 of the first semiconductor layer 4 into sections 151 that will form back gate conductors for the back gates 112, 122. Thus, these DT isolation structures 140 not only define the size and shape of the back gates 112, 122, but also isolate the back gates 112, 122. Each back gate conductor (i.e., each section 151 of portion 150) is appropriately doped with either a p-type dopant or an n-type dopant for incorporation into either a p-FET 110 or an n-FET 120, respectively.

The first device 110, 120 further comprises contacts 160 to each of the discrete back gates 112, 122 so as to allow independent threshold voltage control of the first FETs 110, 120 despite performance degradation of the first device 100 due to parasitic back gate capacitance.

The second device 200 can comprise one or more single-gated fully-depleted FETs 210, 220 (i.e., second field effect transistors each having only a front gate 211, 221). As with the first device 100, the second device 200 can also include at least one n-type FET 220 and at least one p-type FET 210. The bodies of each second FET 210, 220 can comprise source/drain diffusion regions 213, 223 and a channel region 214, 224 within the ultra-thin second semiconductor layer 6. The FET bodies can be isolated by shallow trench isolation (STI) structures 230 that extend through the second semiconductor layer 6 to the second insulator layer 5. As mentioned above, those skilled in the art will recognize that if the second semiconductor layer 6 is less than 20 nm thick, then the resultant FETs 210, 220 will be fully-depleted.

Each second FET 210, 220 comprises a front gate 211, 221 above the channel region 214, 224 (i.e., a gate dielectric above the channel region and a gate conductor above the gate dielectric). The gate conductor can, for example, comprise a p+ doped polysilicon for p-FET 210 or an n+ doped polysilicon for the n-FET 220. This front gate 211, 221 can be used to control output current. However, instead of a back gate for each second FET 210, 220, the second portion 250 of the semiconductor layer 4 below the second device 200 remains un-doped (i.e., intrinsic). Specifically, this second portion 250 comprises a remaining portion of the first intrinsic semiconductor layer 4 after the formation and doping of the discrete back gates 112, 122 for the first FETs 110, 120. Since the second portion 250 of the first semiconductor layer 4 below the second device 200 is neither doped, nor contacted, it functions not as a back gate but simply as an added insulator for the second device 200 and, thus, allows the second device 200 to avoid performance degradation caused by parasitic back gate capacitance.

Consequently, since the fully-depleted first FETs 110, 120 that are incorporated into the first device 100 are formed with back gates 112, 122 and back gate contacts 160, the threshold voltage of these FETs 110, 120 may be independently controlled. Despite the resultant performance degradation due to parasitic back gate capacitance, these back gates result in a net gain for devices 100 such as, SRAM cells, which require precise threshold voltage control. Contrarily, the second device 200 incorporates the fully-depleted second FETs 210, 220 that are formed above an un-contacted intrinsic portion 250 of a semiconductor layer. Despite marginal threshold voltage control due to the absence of back gates, the lack of capacitance loading (i.e., back gate capacitance) and the added insulation result in a net gain for high performance devices 200 such as, logic circuits.

Figure 2:
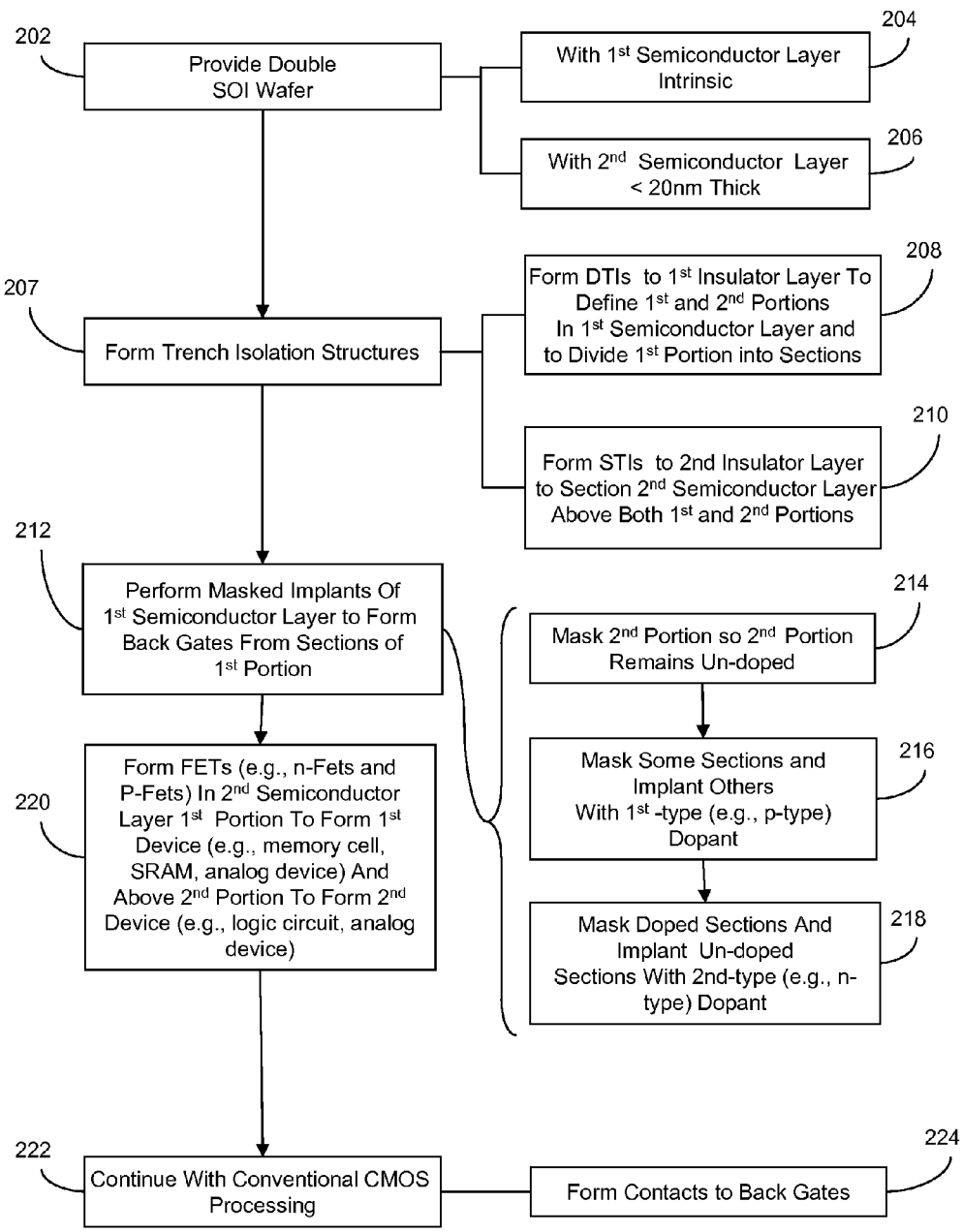
FIG. 2 is a schematic flow diagram illustrating a method of forming the semiconductor structure of the invention.
Figure 3:
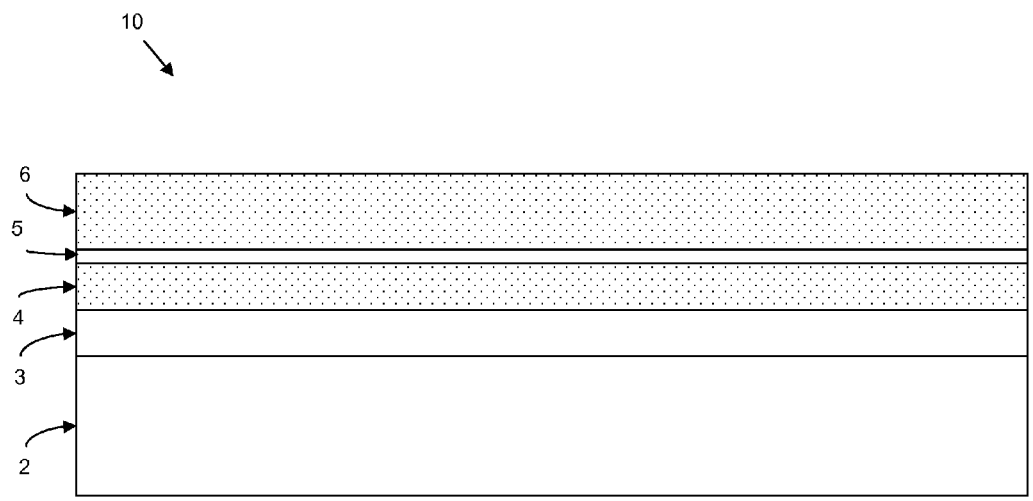
FIG. 3 is a schematic block diagram illustrating a cross-sectional view of a partially completed structure of the invention.

Referring to FIG. 2, an embodiment of the method of the invention comprises first providing a wafer 10 having a first insulator layer 3 (e.g., a first buried oxide layer) on a semiconductor substrate 2 (e.g., a silicon substrate), a first intrinsic semiconductor layer 4 (e.g., an un-doped silicon or polysilicon layer) on the first insulator layer 3, a second insulator layer 5 (e.g., a second buried oxide layer) on the first semiconductor layer 4 and a second semiconductor layer 6 (e.g., a sub-20 nm silicon layer) on the second insulator layer 5 (202-206; see FIG. 3).

Figure 4:
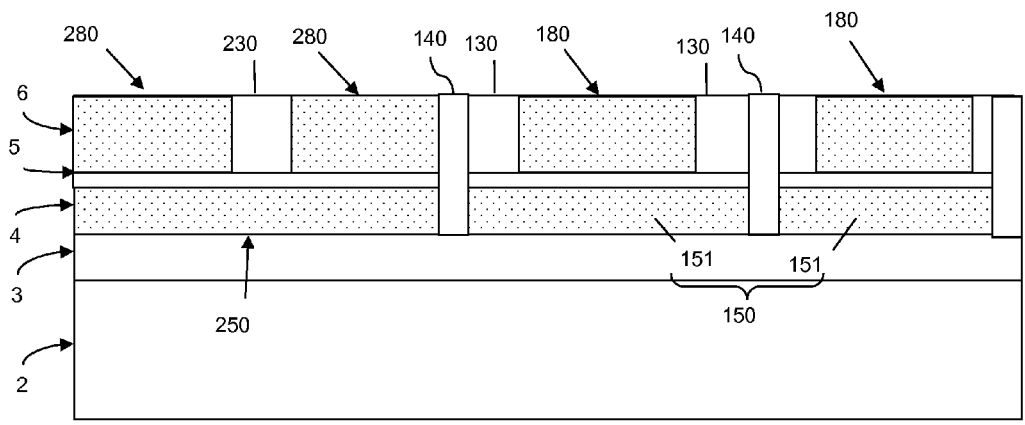
FIG. 4 is a schematic block diagram illustrating a cross-sectional view of a partially completed structure of the invention.

Shallow and deep trench (DT) isolation structures are formed in the wafer using conventional processes (207; see FIG. 4). The deep trench isolation 140 structures are formed so that they extend through the second semiconductor layer 6 to the first insulator layer 3. These deep trench isolation structures 140 will define the size and shape of the subsequently formed back gates as well as isolate those back gates once formed. Specifically, these deep trench isolation structures 140 divide the first intrinsic semiconductor layer 4 into a first portion 150 and a second portion 250 and further divide the first portion 150 into multiple sections 151. The shallow trench isolation 130, 230 structures are formed so that they extend through the second semiconductor layer 6 to the second insulator layer 5 (208). These shallow trench isolation 130, 230 structures divide up the second semiconductor layer 6 into additional sections 180, 280 above the first portion 150 and second portion 250 of the first semiconductor layer 4, respectively (210). These additional sections 180, 280 will subsequently be used to form field effect transistors for a first device 100 above the first portion 150 and for a second device 200 above the second portion 250.

Figure 5:
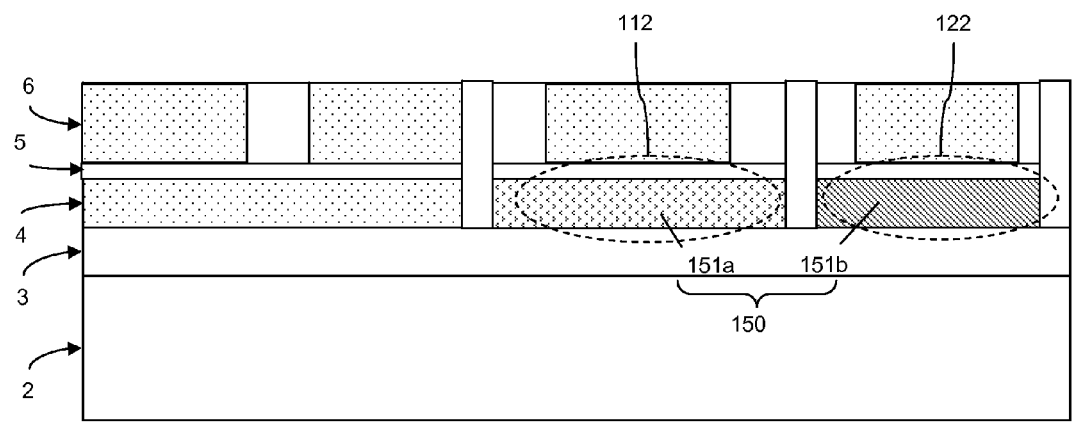
FIG. 5 is a schematic block diagram illustrating a cross-sectional view of a partially completed structure of the invention.

After the trench isolation structures are formed (at process 207), a mask is formed over the second portion 250 and the various sections 151 of the first portion 150 of the first semiconductor layer 4 are implanted with dopants to form back gates 112, 122 (212). Specifically, a masked implantation process can be used to form in each section 151 either an n-FET back gate or a p-FET back gate. More specifically, the second portion 250 is masked (214). Additionally, one or more of the sections 151 of the first portion 150 (i.e., a first group 151b of one or more sections) are masked. Then, any unmasked sections (i.e., a second group 151a of one or more sections) are implanted with a first conductivity type dopant to form at least one doped back gate for at least one first conductivity type FET (216). For example, a p-type dopant such as, boron (B), can be implanted into first section 151a to form at least one p-doped polysilicon back gate conductor for at least one p-FET (see FIG. 5). Following the first implant, the mask over the first group 151b of sections is removed and the second (doped) group 151a is masked. A second implantation process implants the unmasked sections 150 (i.e., the first group 151b of one or more sections) with a second conductivity type dopant to form at least one doped back gate for at least one second conductivity type FET (218). For example, an n-type dopant such as, phosphorus (P), arsenic (As) or antimony (Sb), can be implanted into the first group 151b of sections to form at least one n-doped polysilicon back gate conductor for at least one n-FET (see FIG. 5).

Once the back gates 112, 122 (including back gate dielectric layer and back gate conductors) are formed for the FETs of the first device (see FIG. 5), conventional complementary metal oxide semiconductor (CMOS) processing continues to form field effect transistors (FETs) 110, 120, 210, 220 in the various sections of the second semiconductor layer (220-222). Specifically, both p-type and n-type FETs 110, 120 can be formed above the p-doped and n-doped back gates 112, 122, respectively, in order to form a first device 100 (e.g., a memory cell, a static random access memory cell, or another device that requires precise Vt control) (see FIG. 1). Additionally, one or more p-type and/or n-type FETs 210, 220 can be formed above the second portion 250 of the first semiconductor layer 4 (i.e., the remaining intrinsic (un-doped) portion of the first semiconductor layer 4) in order to form a second device 200 (e.g., a logic circuit or another high performance device) (see FIG. 1). As mentioned above, those skilled in the art will recognize that if the second semiconductor layer 6 is less than 20 nm thick, then the resultant FETs 110, 120, 210, 220 will be fully-depleted.

Figure 6:
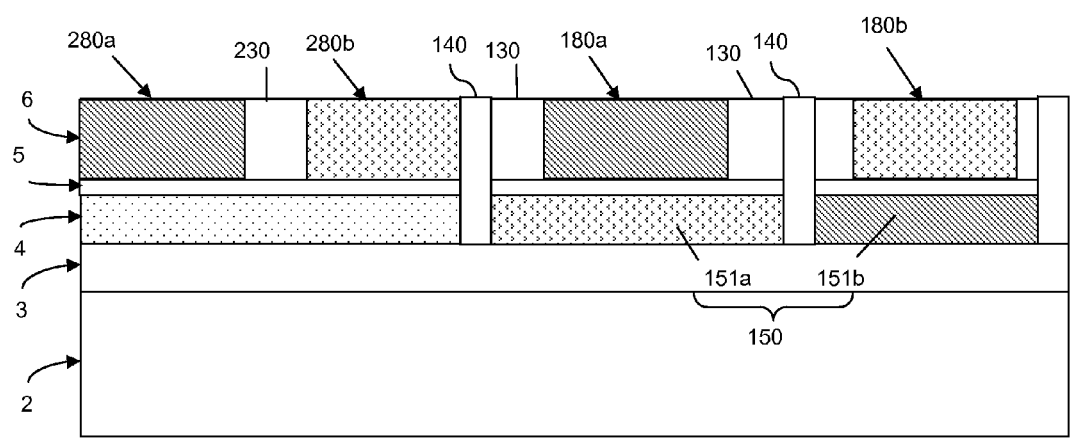
FIG. 6 is a schematic block diagram illustrating a cross-sectional view of a partially completed structure of the invention.

As with the doping of the back gates, the forming of the various p-type and n-type FETs in the second semiconductor layer 6 can be accomplished using a masked implantation process. Specifically, the bodies for each FET (i.e., sections 180, 280 of the second semiconductor layer 6) can be appropriately doped. For example, the sections 180b, 280b of the second semiconductor layer 6 that designated for n-FETs 120, 220 can be doped with a p-type dopant (e.g., boron (B)) and the sections 180a, 280a that are designated for p-FETs 110, 210 can be doped with an n-type dopant (e.g., phosphorus (P), antimony (Sb), or arsenic (As)) (see FIG. 6).

Figure 7:
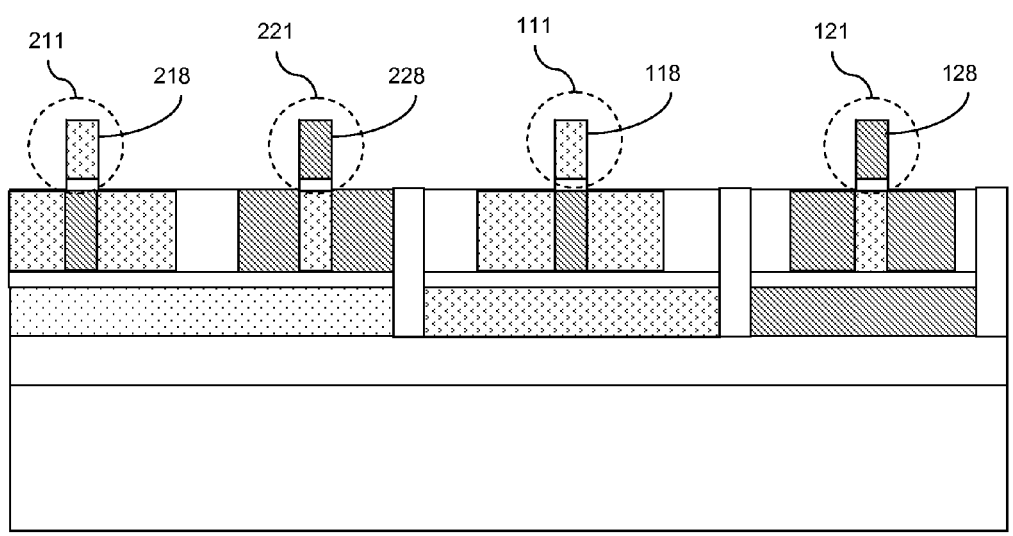
FIG. 7 is a schematic block diagram illustrating a cross-sectional view of a partially completed structure of the invention.

The front gates 111, 121, 211, 221 for each FET 110, 210, 210, 220 of each device 100, 200, respectively, can also be formed using conventional CMOS processing. For example, a gate stack (e.g., a dielectric layer and a polysilicon layer) can be deposited, lithographically patterned, and appropriately doped to form front gates with p-doped polysiclion gate conductors 118, 218 for p-FETs 110, 210 and n-doped polysilicon gate conductors f128, 228 for n-FETs 120, 220 (see FIGS. 1 and 7 in combination).

Additionally, processing may include, but is not limited to the following: forming halos; doping source/drain extensions; doping source/drain diffusion regions 112, 123, 213, 223; forming spacers; forming silicides (e.g., Co, Ni, Etc.) on the top surfaces of the source/drain diffusion regions 112, 123, 213, 223 and the front gates 111, 121, 211, 221; depositing and planarizing a back end of the line (BEOL) insulator layer 7; forming source/drain contacts and forming gate contacts. Specifically, isolated contacts 160 to the back gates 112, 122 can be formed by etching a contact hole (e.g., through the BEOL insulator 7, STIs 130 and second insulator layer 5 to the back gates 112, 122) and filling the contact hole with a conductive material (e.g., n-doped polysilicon for n-FETs 120 and p-doped polysilicon for p-FETs 110).

Therefore, disclosed above are embodiments of a semiconductor structure and a method of forming the structure. The structure integrates a first fully-depleted device (e.g., an SRAM cell having multiple FETs) and a second fully-depleted device (e.g., a logic circuit having at least one FET) on the same wafer above a semiconductor layer. Sections of a first portion of the semiconductor layer below the first device are appropriately doped and contacted to form back gates for the FETs of the first device. A second portion of the semiconductor layer below the second device remains un-doped and un-contact and, thus, only functions as an added insulator and not a back gate. Since the first device FETs are formed with back gates/back gate contacts, the threshold voltage of these FETs may be independently controlled. Despite the performance degradation of the first device due to back gate capacitance, the back gates result in a net gain for devices such as, SRAM cells, which require precise threshold voltage control. Contrarily, despite marginal threshold voltage control in the second device due to the absence of back gates, the lack of capacitance loading and the added insulation result in a net gain for high performance devices such as, logic circuits.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A semiconductor structure comprising:
    a substrate;
    a first field effect transistor above said substrate;
    a second field effect transistor above said substrate and positioned laterally adjacent to said first field effect transistor; and
    a semiconductor layer above said substrate and below said first field effect transistor and said second field effect transistor, wherein a first portion of said semiconductor layer below said first field effect transistor is doped and comprises a back gate for said first field effect transistor and wherein a second portion of said semiconductor layer below said second field effect transistor is un-doped, and
    wherein said first field effect transistor and said second field effect transistor each comprise planar metal oxide semiconductor field effect transistors with source and drain diffusion regions and a channel region between said source and drain diffusion regions in a section of a sub-20 nm silicon layer above said substrate.

2. The semiconductor structure of claim 1, further comprising a contact to said back gate so as to allow independent threshold voltage control of said first field effect transistor despite performance degradation of said first field effect transistor caused by parasitic back gate capacitance.

3. The semiconductor structure of claim 1, wherein said second field effect transistor is positioned on said second portion in order to avoid performance degradation due to parasitic back gate capacitance.

4. The semiconductor structure of claim 1, further comprising a trench isolation structure that defines the limits of and isolates said back gate.

5. A semiconductor structure comprising:
    a substrate;
    a memory cell above said substrate, wherein said memory cell comprises a plurality of first field effect transistors;
    a logic circuit above said substrate, positioned laterally adjacent to said memory cell and comprising at least one second field effect transistor; and
    a semiconductor layer above said substrate and below said memory cell and said logic circuit, wherein sections of a first portion of said semiconductor layer below said memory cell are doped and comprise discrete back gates for said first field effect transistors, wherein a second portion of said semiconductor layer below said second device is un-doped, and wherein said first field effect transistors and said at least one second field effect transistor are both fully-depleted, and
    wherein said plurality of first field effect transistors and said at least one second field effect transistor each comprise planar metal oxide semiconductor filed effect transistors with source and drain diffusion regions and a channel region between said source and drain diffusion regions in a section of a sub-20 nm silicon layer above said substrate.

6. The semiconductor structure of claim 5, wherein said memory cell comprises a static random access memory cell.

7. The semiconductor structure of claim 5, wherein said plurality of first field effect transistors comprises at least one n-type field effect transistor and at least one p-type field effect transistor and wherein said discrete back gates are n-type dopants and p-type dopants, respectively.

8. The semiconductor structure of claim 5, further comprising contacts to said back gates so as to allow independent threshold voltage control of said first field effect transistors despite performance degradation of said memory cell due to parasitic back gate capacitance.

9. The semiconductor structure of claim 5, wherein said logic circuit is positioned on said second portion in order to avoid performance degradation caused by parasitic back gate capacitance.

10. The semiconductor structure of claim 5, further comprising a plurality of trench isolation structures that define the limits of and isolate said back gates within said first portion.

11. A method of forming a semiconductor structure comprising:
    providing a wafer having a first semiconductor layer on a first insulator layer, a second insulator layer on said first semiconductor layer and a second semiconductor layer on said second insulator layer, wherein said first semiconductor layer is un-doped;
    implanting sections of a first portion of said first semiconductor layer with different type dopants to form discrete back gates, wherein during said implanting, masking a second portion of said first semiconductor layer so that said second portion remains un-doped;
    forming at least two different type planar first field effect transistors for a first device in said second semiconductor layer above said discrete back gates and further forming at least one planar second field effect transistor for a second device in said second semiconductor layer above said second portion and positioned laterally adjacent to said first field effect transistors.

12. The method of claim 11, further comprising before said implanting, forming trench isolation structures that extend through said second semiconductor layer to said first insulator layer so as define said first portion, said sections of said first portion and said second portion in said first semiconductor layer.

13. The method of claim 11, wherein said implanting further comprises:
    masking a first group of said sections;
    implanting a second group of said sections with a p-type dopant to form at least one p-doped back gate for at least one p-type field effect transistor;
    masking said second group; and
    implanting said first group with an n-type dopant to form at least one n-doped back gate for at least one n-type field effect transistor.

14. The method of claim 11, wherein said second semiconductor layer comprises a sub-20 nm semiconductor layer.

15. The method of claim 11, further comprising forming contacts to said back gates to allow for independent threshold voltage control despite performance degradation to said first device due to parasitic back gate capacitance.

16. The method of claim 11, wherein said second device is formed above said second portion in order to avoid performance degradation due to parasitic back gate capacitance.

17. A method of forming a semiconductor structure comprising:
    providing a wafer having a first semiconductor layer on a first insulator layer, a second insulator layer on said first semiconductor layer and a second semiconductor layer on said second insulator layer, wherein said first semiconductor layer is un-doped;
    implanting sections of a first portion of said first semiconductor layer with different type dopants to form discrete back gates, wherein during said implanting, masking a second portion of said first semiconductor layer so that said second portion remains un-doped; and
    forming at least two different type first field effect transistors for a static random access memory cell in said second semiconductor layer above said discrete back gates and further forming at least one second field effect transistor for a logic circuit in said second semiconductor layer above said second portion and positioned laterally adjacent to said first field effect transistors.

18. The method of claim 17, further comprising before said implanting, forming trench isolation structures that extend through said second semiconductor layer to said first insulator layer so as define said first portion, said sections of said first portion and said second portion in said first semiconductor layer.

* * * * *